United States Patent
Lashkarian et al.

(10) Patent No.: US 9,577,771 B1
(45) Date of Patent: Feb. 21, 2017

(54) RADIO FREQUENCY TIME SKEW CALIBRATION SYSTEMS AND METHODS

(71) Applicant: Apple Inc., Cupertino, CA (US)

(72) Inventors: Navid Lashkarian, Pleasanton, CA (US); Saeed Chehrazi, Pleasant Hill, CA (US); Ali Parsa, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/218,923

(22) Filed: Jul. 25, 2016

(51) Int. Cl.
*H04L 25/03* (2006.01)
*H04B 17/21* (2015.01)
*H04B 17/24* (2015.01)

(52) U.S. Cl.
CPC .............. *H04B 17/21* (2015.01); *H04B 17/24* (2015.01)

(58) Field of Classification Search
USPC ........ 375/295, 296, 297; 330/260, 278, 279, 330/280, 291, 294
See application file for complete search history.

(56) References Cited

U.S. PATENT DOCUMENTS

| | | | |
|---|---|---|---|
| 6,525,577 B2 | 2/2003 | Lee | |
| 7,212,791 B2 * | 5/2007 | Arayashiki | H03F 1/0222 375/300 |
| 7,346,122 B1 * | 3/2008 | Cao | H03F 1/0211 375/285 |
| 7,359,685 B2 * | 4/2008 | Jafari | H04B 1/0475 375/300 |
| 7,379,715 B2 * | 5/2008 | Udagawa | H04B 1/0475 330/149 |
| 7,596,184 B2 * | 9/2009 | Ahmed | H03C 5/00 375/296 |
| 7,817,747 B2 | 10/2010 | Waheed et al. | |
| 8,126,411 B2 * | 2/2012 | Kim | H03F 1/0222 455/108 |
| 8,514,972 B2 * | 8/2013 | Kang | H04L 27/361 375/285 |
| 9,184,834 B1 | 11/2015 | Zhang et al. | |
| 9,344,108 B2 * | 5/2016 | Hampel | H03M 3/506 |
| 2004/0085127 A1 * | 5/2004 | Matsuyoshi | H03F 1/32 330/136 |
| 2006/0009169 A1 * | 1/2006 | Arayashiki | H03F 1/32 455/108 |
| 2007/0189431 A1 | 8/2007 | Waheed et al. | |
| 2007/0230612 A1 * | 10/2007 | Ahmed | H03C 5/00 375/295 |
| 2008/0205571 A1 | 8/2008 | Muhammad et al. | |

(Continued)

*Primary Examiner* — Tesfaldet Bocure
(74) *Attorney, Agent, or Firm* — Fletcher Yoder PC

(57) ABSTRACT

Systems and method for improving operation of a radio frequency system are provided. One embodiment provides a radio frequency system that includes an amplifier device with a first data path and a second data path. Additionally, the radio frequency system includes a controller that instructs the radio frequency system to transmit a calibration signal, which includes a first portion that excites the first data path and a second portion that excites the second data path; determines time skew between the first and second data paths based at least in part on phase shift between a first sample of a feedback signal and the first portion, phase shift between a second sample of the feedback signal and the second portion, or both; and instructs the radio frequency system to adjust delay applied on the first data path, the second data path, or both based at least on the time skew.

20 Claims, 10 Drawing Sheets

(56) References Cited

U.S. PATENT DOCUMENTS

2009/0096499 A1* 4/2009 Kim .................. H03F 3/24
327/161
2010/0254299 A1* 10/2010 Kenington ............. H01Q 3/267
370/315
2010/0254441 A1* 10/2010 Kenington ............ H03F 1/3247
375/214

* cited by examiner

RADIO FREQUENCY TIME SKEW CALIBRATION SYSTEMS AND METHODS

BACKGROUND

The present disclosure relates generally to radio frequency systems and, more particularly, an amplifier device used in a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often include a radio frequency system to facilitate wireless communication of data with another electronic device and/or a network. To facilitate wireless communication, the radio frequency system may include a transceiver that outputs an analog representation of at least one component (e.g., phase and/or amplitude) of the data to be wirelessly transmitted as an analog electrical signal and/or a digital representation of at least one component of the data to be wirelessly transmitted as a digital electrical signal. Since the electronic device may be separated from the other electronic device and/or network by some distance, the radio frequency system may include an amplifier device that generates an amplified analog electrical signal by amplifying the analog electrical signal to a target magnitude (e.g., strength).

To facilitate generating the amplified analog electrical signal, the amplifier device may process the electrical signal using multiple data paths. For example, when implementing envelope elimination and restoration (EER), the amplifier device may include a first data path that process an amplitude component of the electrical signal and a second data path that processes a phase component of the electrical signal. Based at least in part on the amplitude component, the envelope data path may adjust voltage supplied to a power amplifier in the amplifier device. In this manner, the power amplifier may recombine the amplitude component with the phase component and increase magnitude based on the voltage supplied from the first data path. Thus, fidelity (e.g., accuracy) of the amplified analog electrical signal to the electrical signal may be dependent on how well synchronized the multiple paths are with one another.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to radio frequency systems used to facilitate wirelessly communicating data. To control output power, the radio frequency system may include an amplifier device that receives an analog and/or a digital representation of the data to be wirelessly communicated and generates an amplified analog electrical signal based at least in part on target output power of the radio frequency system. In some embodiments, the amplifier device may include multiple data paths that process an analog electrical signal (e.g., analog representation of at least one component of the data) and/or a digital electrical signal (e.g., digital representation of at least one component of the data). To generate the amplified analog electrical signal, the amplifier device may combine (e.g., mix) output data from the multiple data paths. As such, fidelity (e.g., accuracy) of the amplified analog electrical signal to the one or more electrical signals and, thus, the data intended to be wirelessly communicated may be dependent on synchronization and/or time skew between the multiple data paths.

To facilitate improving fidelity (e.g., accuracy) of data wirelessly transmitted from the radio frequency system, the present disclosure provides techniques to adjust (e.g., reduce) time skew between the multiple data paths, thereby improving synchronization. In some embodiments, the amplifier device may include one or more delay devices, which may be operated to introduce delay on one or more data paths. Thus, the radio frequency system may adjust operation of the one or more delay devices, for example, to reduce time skew between the multiple data paths.

In some embodiments, to facilitate determining the time skew, a controller may instruct the radio frequency system to transmit a calibration signal and determine a feedback signal based at least in part on the resulting transmitted analog electrical signal. For example, the controller may determine a total delay of the radio frequency system based at least in part on cross-correlation between a sample of the feedback signal and the calibration signal.

In some embodiments, the calibration signal may include multiple portions, each of which is intended to excite one data path in the amplifier device. For example, the calibration signal may include a first portion with a changing amplitude component and a constant phase component, thereby exciting an envelope data path without exciting a phase data path when transmitted. Additionally, the calibration signal may include a second portion with a constant amplitude component and a changing phase component, thereby exciting the phase data path without exciting the envelope data path when transmitted.

In this manner, the calibration signal may also enable the controller to determine a relative delay of each of the multiple data paths. For example, the controller may determine the relative delay of a data path by comparing a portion of the calibration signal that excites the data path with a sample of the feedback signal that results from transmission of the portion. To facilitate determining the sample, the controller may adjust (e.g., time shift) the feedback signal based at least in part on the total delay of the radio frequency system, for example, to isolate delay caused by the amplifier device, and thus an excited data path, from delay caused by other components in the radio frequency system.

In some embodiments, the controller may determine relative delay of the data path based at least in part on phase shift between the portion of the calibration signal and the sample of the feedback signal resulting from transmission of the portion. For example, relative delay on the envelope data path may be proportional to a first phase shift between the first portion of the calibration signal and a first sample of the feedback signal resulting from transmission of the first portion. Additionally, relative delay on the phase data path may be proportional to a linear component of a second phase shift between the second portion of the calibration signal and a second sample of the feedback signal resulting from transmission of the second portion.

BRIEF DESCRIPTION OF THE DRAWINGS

Various aspects of this disclosure may be better understood upon reading the following detailed description and upon reference to the drawings in which.

DETAILED DESCRIPTION

Figure 1:
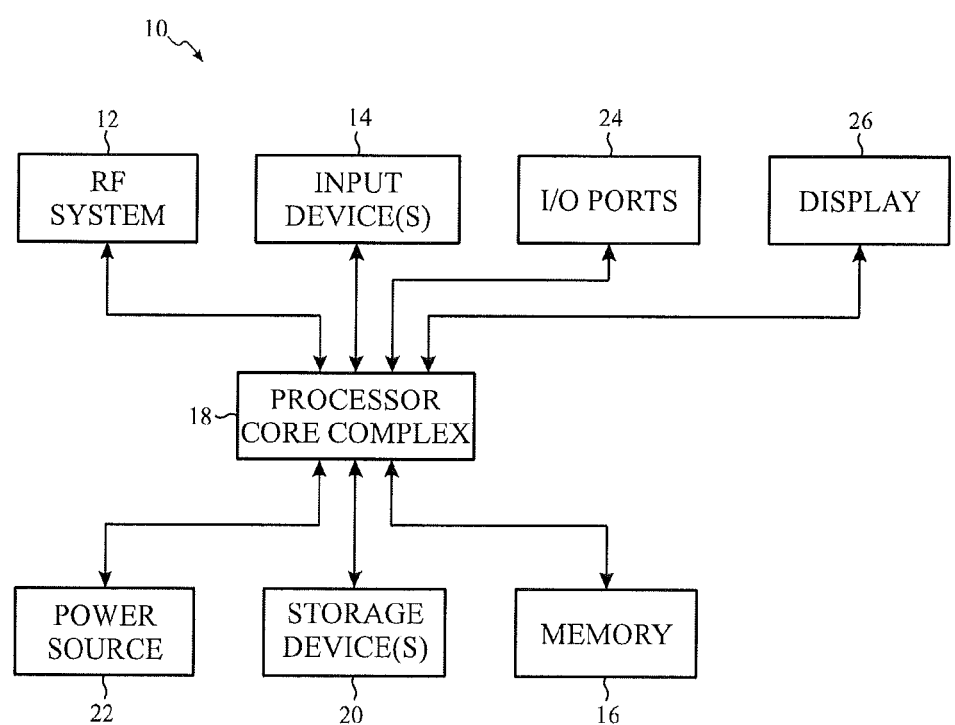
FIG. 1 is a block diagram of an electronic device with a radio frequency system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logic OR) and not exclusive (e.g., logic XOR). In other words, the phase A "or" B is intended to mean A, B, or both A and B.

The present disclosure relates to radio frequency systems used to facilitate wirelessly communicating data between an electronic device and another electronic device and/or a network. For example, a radio frequency system may wirelessly communicate data by transmitting radio waves modulated in manner representative of the data, for example, via a personal area network (e.g., Bluetooth network), a local area network (e.g., an 802.11x Wi-Fi network), and/or a wide area network (e.g., a 4G or LTE cellular network). In other words, radio frequency systems may utilize various wireless communication protocols to facilitate wireless communication of data.

Regardless of the wireless communication protocol, operation of radio frequency systems may be generally similar. For example, generally, processing circuitry may generate a digital representation of the data to be transmitted as a digital electrical signal and a transceiver (e.g., a transmitter and/or a receiver) may convert at least one component (e.g., phase and/or amplitude component) of the data indicated by the digital electrical signal into an analog electrical signal. Based on various factors (e.g., wireless communication protocol, power consumption, distance, etc.), the analog electrical signal may be wirelessly transmitted at various output powers. To facilitate controlling the output power, the radio frequency system may include an amplifier device, which receives the analog electrical signal and outputs an amplified analog electrical signal at a target output power for transmission, for example, via an antenna as modulated radio waves.

Various implementations of amplifier devices may be suitable for generating the amplified analog electrical signal at the target output power. In some implementations, an amplifier device may processes the analog electrical signal and/or the digital electrical signal using multiple data paths. For example, when implementing envelope elimination and restoration (EER), the amplifier device may include an envelope data path that process an amplitude component of data and a phase data path that processes a phase component of the data. Additionally, when implementing envelope tracking (ET), the amplifier device may include an envelope data path that processes the amplitude component and a signal data path that processes the both the amplitude component and the phase component of the data.

When utilizing multiple data paths, the amplifier device may generate the amplified electrical signal based at least in part on output data received from each of the data paths. For example, when implementing envelope elimination and restoration, the power amplifier may receive the phase component from the phase data path and a supply voltage generated based at least in part on the amplitude component from the envelope data path. Additionally, when implementing envelope tracking, the power amplifier may receive the analog electrical signal from the signal data path and a supply voltage generated based at least on the amplitude component from the envelope data path.

In this manner, the power amplifier may combine (e.g., mix) the received output data from the various data paths to generate the amplified analog electrical signal. For example, to generate the amplified analog electrical signal corresponding with a point on an analog electrical signal, the power amplifier may combine output data corresponding with the point received from a first data path (e.g., envelope data path) and output data corresponding with the point received from a second data path (e.g., phase data path or signal data path).

However, in some instances, varying delay on the first data path and the second data path may cause the power amplifier to combine output data corresponding with different points on the analog electrical signal, which may affect fidelity of the amplified analog electrical signal to the analog electrical signal and, thus, the data intended to be wirelessly communicated. In other words, fidelity of the amplified analog electrical signal may be dependent on at least synchronization and/or time skew between the multiple data paths. In fact, to provide sufficient fidelity when implementing envelope elimination and restoration, the time skew may be less than 40 psec.

Accordingly, the present disclosure provides techniques to improve fidelity (e.g., accuracy) of data wireless transmitted from a radio frequency system, for example, by facilitating reduction in time skew between multiple data paths in an amplifier device of the radio frequency system. In some embodiments, the amplifier device may include one or more delay devices, which may be operated to introduce delay on one or more data paths. For example, a controller may instruct a delay device to introduce a time delay on a first data path to reduce time skew between the first data path and a second data path in the amplifier device and, thus, improving accuracy of an amplified analog electrical signal generated based on output data received from the first data path and the second data path.

Accordingly, to determine the amount of time delay to introduce, the controller may determine time skew between the data paths. In some embodiments, to facilitate determining the time skew, the controller may instruct the radio frequency system to transmit a calibration signal and determine a feedback signal based at least in part on a transmitted analog electrical signal resulting from transmission of the calibration signal. Additionally, in some embodiments, the calibration signal may include multiple portions, each of which is intended to excite one data path in the amplifier device. For example, when the amplifier device implements envelope elimination and restoration, the calibration signal may include a first portion (e.g., half) with a changing amplitude component and a constant phase component, thereby exciting an envelope data path without exciting a phase data path when transmitted. Additionally, the calibration signal may include a second portion (e.g., half) with a constant amplitude component and a changing phase component, thereby exciting the phase data path without exciting the envelope data path when transmitted.

Based on transmission of the calibration signal, the controller may determine a total delay introduced by the radio frequency system. In some embodiments, to determine the total delay, the controller may determine a sample of the feedback signal and determining cross-correlation between the sample and the calibration signal. For example, the controller may determine that the total delay is the lag resulting in the largest (e.g., peak) cross-correlation value.

Based at least in part on the total delay, the controller may determine relative delay of each data path. In some embodiments, the controller may determine relative delay of a data path by comparing a portion of the calibration signal that excites the data path with a sample of the feedback signal that results from transmission of the portion. To facilitate determining the sample, the controller may adjust (e.g., time shift) the feedback signal based at least in part on the total delay of the radio frequency system, for example, to isolate delay caused by the amplifier device from delay caused by other components of the radio frequency system.

Additionally, in some embodiments, the controller may determine relative delay of the data path based at least in part on phase shift between the portion of the calibration signal and the sample of the feedback signal resulting from transmission of the portion. For example, when the amplifier device implements envelope elimination and restoration, the controller may determine relative delay of the envelope data path based at least in part on a first phase shift between the first portion of the calibration signal and a first sample of the feedback signal resulting from transmission of the first portion. In some embodiments, the relative delay of the envelope data path may be proportional to the first phase shift. Additionally, the controller may determine relative delay of the phase data path based at least in part on phase shift between the second portion of the calibration signal and a second sample of the feedback signal resulting from transmission of the second portion. In some embodiments, the relative delay of the phase data path may be proportional to a linear component of the second phase shift.

Based at least in part on the relative data path delays, the controller may determine time skew between the data paths. For example, the time skew may be the difference between the relative delay of the envelope data path and the relative delay of the phase data path. Additionally, when the time skew is greater than a threshold (e.g., 40 psec), the controller may instruct a delay device to adjust delay applied on a corresponding data path. For example, when the relative delay of the phase data path is greater than the relative delay of the envelope data path by more than the threshold, the controller may instruct a delay device to increase delay applied on the envelope data path. In this manner, the radio frequency system may reduce time skew between multiple data paths in the amplifier device, thereby facilitating improved fidelity of amplified analog electrical signals generated by the amplifier device.

To help illustrate, one embodiment of an electronic device 10 including a radio frequency system 12 is shown in FIG. 1. As will be described in more detail below, the electronic device 10 may be any suitable electronic device, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

In the depicted embodiment, the electronic device 10 includes the radio frequency system 12, one or more input devices 14, local memory 16, a processor core complex 18, one or more main memory storage devices 20, a power source 22, one or more input/output ports 24, and an electronic display 26. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 16 and a main memory storage device 20 may be included in a single component.

As depicted, the processor core complex 18 is operably coupled with local memory 16 and the main memory storage device 20. Thus, the processor core complex 18 may execute instruction stored in local memory 16 and/or the main memory storage device 20 to perform operations, such as instructing the radio frequency system 12 to communicate with another electronic device and/or a network. As such, the processor core complex 18 may include one or more general purpose microprocessors, one or more application specific processors (ASICs), one or more field programmable logic arrays (FPGAs), or any combination thereof.

In addition to the instructions, the local memory 16 and/or the main memory storage device 20 may store data to be processed by the processor core complex 18. Thus, in some embodiments, the local memory and/or the main memory storage device 20 may include one or more tangible, non-transitory, computer-readable mediums. For example, the local memory 16 may include random access memory (RAM) and the main memory storage device 20 may include read only memory (ROM), rewritable non-volatile memory such as flash memory, hard drives, optical discs, and the like.

As depicted, the processor core complex 18 is also operably coupled with the I/O ports 24. In some embodiments, the I/O ports 24 may enable the electronic device 10 to interface with other electronic devices. For example, a portable storage device may be connected to an I/O port 24, thereby enabling the processor core complex 18 to communicate data with a portable storage device.

Additionally, as depicted, the processor core complex 18 is operably coupled to the power source 22. In some embodiments, the power source 22 may provide power to one or more components in the electronic device 10, such as the processor core complex 18 and/or the radio frequency system 12. Thus, the power source 22 may include any suitable energy source, such as a rechargeable lithium polymer (Li-poly) battery and/or an alternating current (AC) power converter.

Furthermore, as depicted, processor core complex 18 is operably coupled with the input devices 14. In some embodiments, the input device 14 may facilitate user interaction with the electronic device 10, for example, by receiving user inputs. Thus, the input devices 14 may include a button, a keyboard, a mouse, a trackpad, and/or the like. Additionally, in some embodiments, the input devices 14 may include touch sensing components in the electronic display 26. In such embodiments, the touch sensing components may receive user inputs by detecting occurrence and/or position of an object touching the surface of the electronic display 26.

In addition to enabling user inputs, the electronic display 26 may display image frames, such as a graphical user interface (GUI) for an operating system, an application interface, a still image, or video content. As depicted, the electronic display 26 is operably coupled to the processor core complex 18. In this manner, the electronic display 26 may display image frames based at least in part on image data received from the processor core complex 18.

As depicted, the processor core complex 18 is also operably coupled with the radio frequency system 12. As described above, the radio frequency system 12 may facilitate wirelessly communicating data with another electronic device and/or a network. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network. In other words, the radio frequency system 12 may enable wirelessly communicating data using various communication protocols and/or at various output powers (e.g., strength of transmitted analog electrical signals).

Even when using different communication protocols, operational principles of radio frequency systems 12 may be generally similar. For example, as will be described in more detail below, the radio frequency system 12 may use a transceiver to convert a digital electrical signal, which digitally represents data to be transmitted, into an analog electrical signal, thereby generating an analog representation of at least one (e.g., phase and/or amplitude) component of the data. Additionally, the radio frequency system 12 may use an amplifier device to amplify the analog electrical signal to a target output power, thereby generating an amplified analog electrical signal. Based at least in part on the amplified analog electrical signal, the radio frequency system 12 may output modulated radio waves to wirelessly communicate the data to another electronic device and/or a network. Due to similarities in operational principles, the techniques described herein may be applicable to any suitable radio frequency system 12 regardless of communication protocol.

Figure 2:
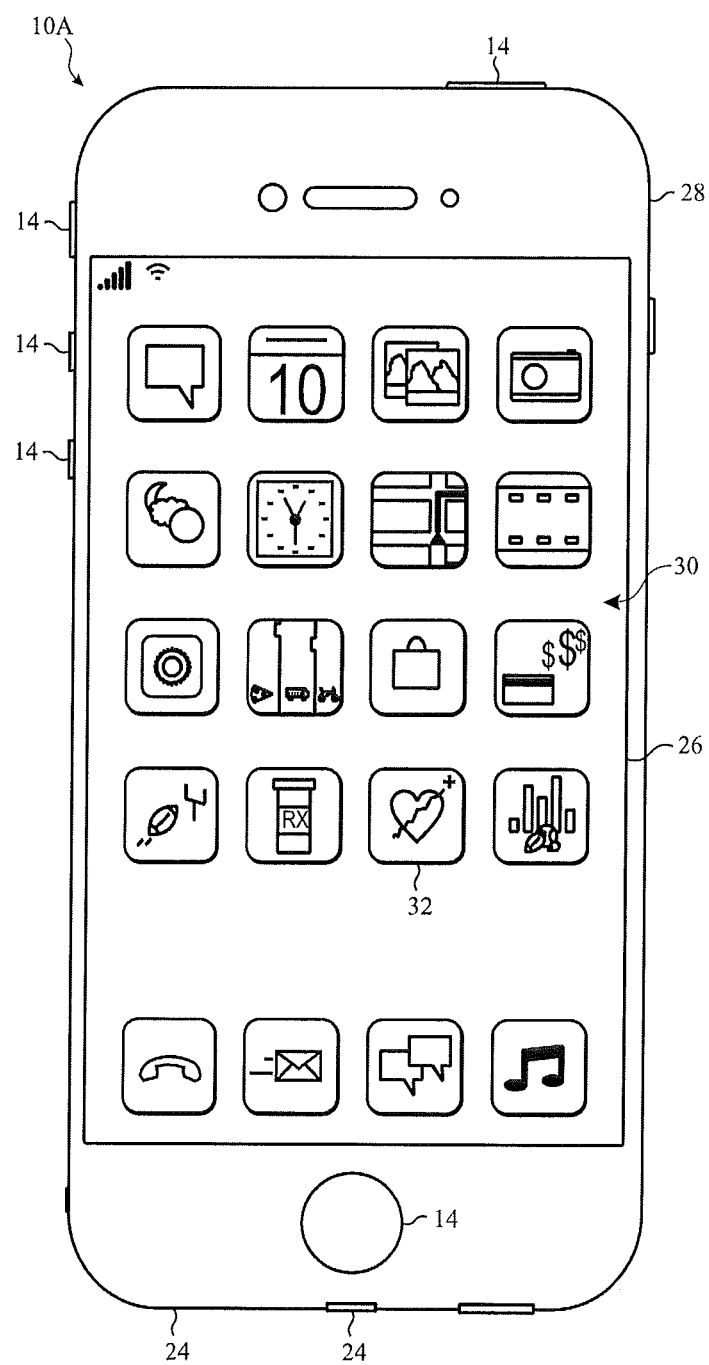
FIG. 2 is an example of the electronic device of FIG. 1, in accordance with an embodiment.

As described above, the electronic device 10 may be any suitable electronic device. To help illustrate, one example of a suitable electronic device 10, specifically a handheld electronic device 10A, is shown in FIG. 2. In some embodiments, the handheld electronic device 10A may be a portable phone, a media player, a personal data organizer, a handheld game platform, and/or the like. For example, the handheld electronic device 10A may be a smart phone, such as any iPhone® model available from Apple Inc.

As depicted, the handheld electronic device 10A includes an enclosure 28 (e.g., housing). In some embodiments, the enclosure 28 may protect interior components from physical damage and/or shield them from electromagnetic interference. Thus, a radio frequency system 12 may also be enclosed within the enclosure 28 and internal to the handheld electronic device 10A.

Additionally, as depicted, the enclosure 28 may surround the electronic display 26. In the depicted embodiment, the electronic display 26 is displaying a graphical user interface (GUI) 30 having an array of icons 32. By way of example, when an icon 32 is selected either by an input device 14 or a touch sensing component of the electronic display 26, an application program may launch.

Furthermore, as depicted, input devices 14 open through the enclosure 28. As described above, the input devices 14 may enable a user to interact with the handheld electronic device 10A. For example, the input devices 14 may enable the user to activate or deactivate the handheld electronic device 10A, navigate a user interface to a home screen, navigate a user interface to a user-configurable application screen, activate a voice-recognition feature, provide volume control, and/or toggle between vibrate and ring modes. As depicted, the I/O ports 24 also open through the enclosure 28. In some embodiments, the I/O ports 24 may include, for example, an audio jack to connect to external devices.

Figure 3:
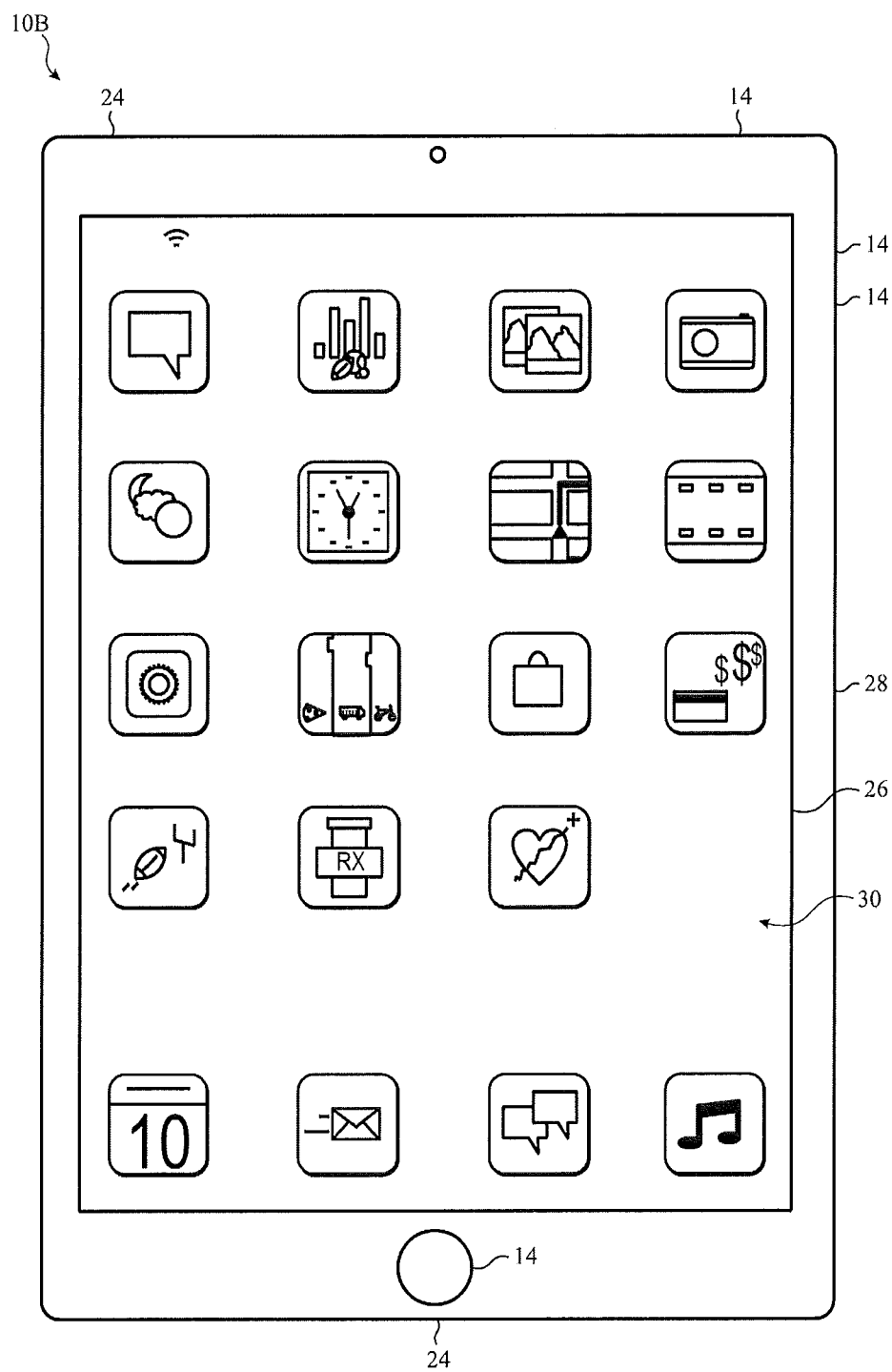
FIG. 3 is an example of the electronic device of FIG. 1, in accordance with an embodiment.
Figure 4:
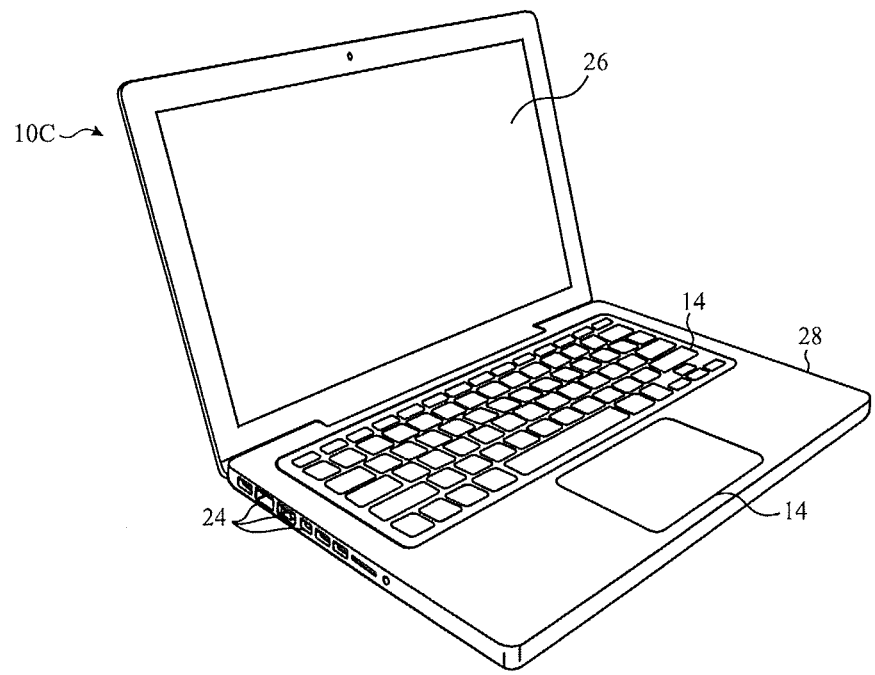
FIG. 4 is an example of the electronic device of FIG. 1, in accordance with an embodiment.
Figure 5:
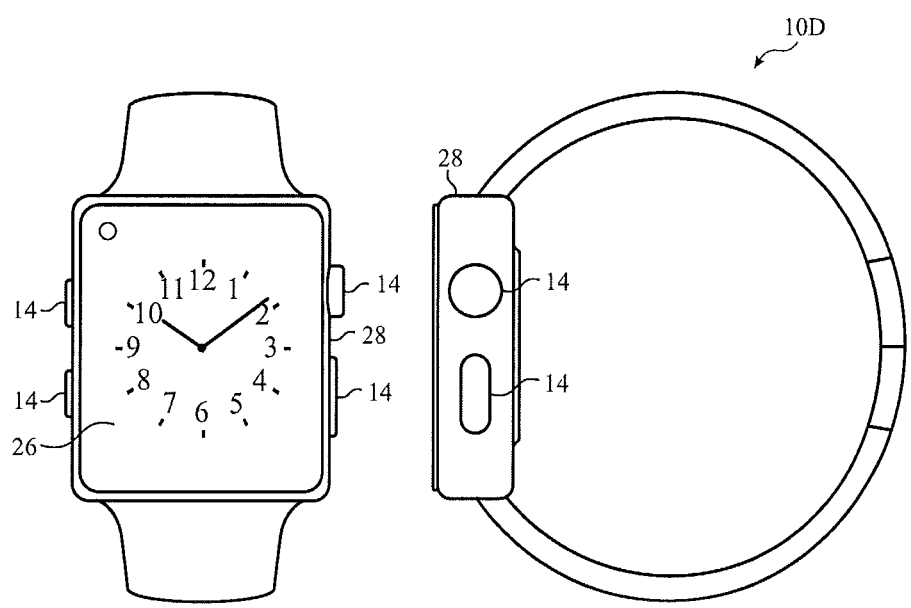
FIG. 5 is an example of the electronic device of FIG. 1, in accordance with an embodiment.

To further illustrate, another example of a suitable electronic device 10, specifically a tablet electronic device 10B is shown in FIG. 3. For example, the tablet electronic device 10B may be any iPad® model available from Apple Inc. A further example of a suitable electronic device 10, specifically a computer 10C, is shown in FIG. 4. For example, the computer 10C may be any Macbook® or iMac® model available from Apple Inc. Another example of a suitable electronic device 10, specifically a watch 10D, is shown in FIG. 5. For example, the watch 10D may be any Apple Watch® model available from Apple Inc.

As depicted, the tablet electronic device 10B, the computer 10C, and the watch 10D each also include an electronic display 26, input devices 14, I/O ports 24, and an enclosure 28. Thus, in some embodiments, the enclosure 28 may enclose a radio frequency system 12 in the tablet electronic device 10B, the computer 10C, and/or the watch 10D. As described above, a radio frequency system 12 may facilitate wirelessly communicating data with other electronic devices and/or a network.

Figure 6:
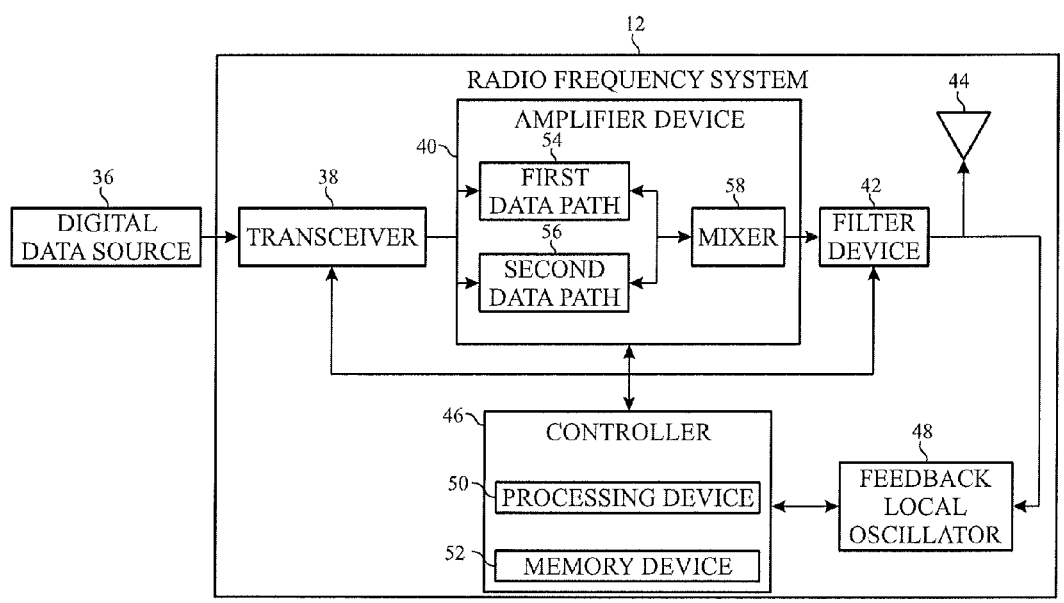
FIG. 6 is block diagram of the radio frequency system of FIG. 1 with an amplifier device, in accordance with an embodiment.

To help illustrate, one example of the radio frequency system 12 is shown in FIG. 6. In the depicted embodiment, the radio frequency system 12 is communicatively coupled to a digital data source 36, which may output a digital representation of data to be transmitted from the electronic device 10 as a digital electrical signal. Accordingly, in some embodiments, the digital data source 36 may be included in the processor core complex 18 and/or in separate processing circuitry, such as a baseband processor or a modem.

Additionally, in the depicted embodiment, the radio frequency system 12 includes a transceiver 38, an amplifier device 40, a filter device 42, an antenna 44, a controller 46, and a feedback local oscillator 48. In some embodiments, the controller 46 may generally control operation of radio frequency system 12. Although depicted as a single controller 46, in other embodiments, one or more separate controllers 46 may be used to control operation of the transceiver 38, the amplifier device 40, the filter device 42, the antenna 44, and/or the feedback local oscillator 48.

To facilitate controlling an operation, the controller 46 may include a processing device 50 and a memory device 52. In some embodiments, the processing device 50 may execute instructions and/or process data stored in the memory device 52 to determine control commands instructing the transceiver 38, the amplifier device 40, the filter device 42, the antenna 44, and/or the feedback local oscillator 48 to perform a control action. In other embodiments, the processing device 50 may be hardwired with instructions that determine control commands when executed. Additionally, in some embodiments, the processing device 50 may be included in the processor core complex 18 and/or separate processing circuitry and the memory device 52 may be included in local memory 16, main memory storage device 20, and/or another, tangible, non-transitory computer-readable medium.

In operation, the transceiver 38 may receive the digital electrical signal and generate an analog electrical signal, which provides an analog representation of at least one component of the data to be transmitted. In some embodiments, the analog electrical signal may be angle modulated and, thus, represented using an in-phase (I) component and a quadrature (Q) component. In such embodiments, the real (e.g., amplitude) component may be expressed as follows:

$$A = \sqrt{I^2 + Q^2} \quad (1)$$

in which, A is the amplitude component, I is the in-phase component, and Q is the quadrature component. Additionally, in such embodiments, the complex (e.g., phase) component may be expressed as follows:

$$P = e^{j\,\tan^{-1}(Q/I)} \quad (2)$$

in which, P is the phase component, I is the in-phase component, and Q is the quadrature component.

Since the output power of the analog electrical signal may be small, the amplifier device 40 may receive and amplify the analog electrical signal. As described above, various implementations of the amplifier device 40 may be used to amplify the analog electrical signal. In some implementations, the amplifier device 40 may utilize multiple (e.g., two or more) data paths, which each processes at least a portion of the analog electrical signal and/or the digital electrical signal. For example, in the depicted embodiment, the amplifier device 40 utilizes a first data path 54 and a second data path 56. The amplifier device 40 may then use a mixer 58 to combine data output from the first data path 54 and the second data path 56 to generate an amplified analog electrical signal at a target output power.

Figure 7A:
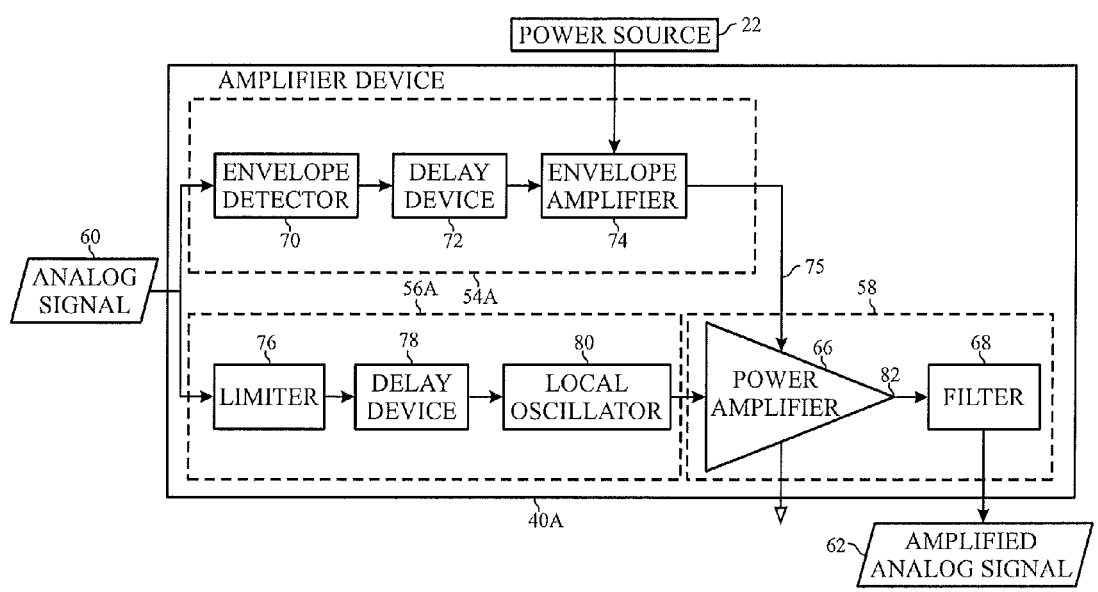
FIG. 7A is a block diagram of one example of the amplifier device of FIG. 6, in accordance with an embodiment.

To help illustrate, one example of an amplifier device 40A with an envelope elimination and restoration (EER) implementation is shown in FIG. 7A. As depicted, the amplifier device 40A receives an analog electrical signal 60 and outputs an amplified analog electrical signal 62. To facilitate generating the amplified analog electrical signal 62, the first data path 54 may be an envelope data path 54A, which operates based at least in part on the amplitude component of the analog electrical signal 60, and the second data path 56 may be a phase data path 56A, which operates based at least in part on the phase component of the analog electrical signal 60. Additionally, in the envelope elimination and restoration implementation, the mixer 58 may include a power amplifier 66 (e.g., a switch mode power amplifier) and a filter 68 (e.g., a low pass filter) to facilitate generating the amplified analog electric signal 62 by combining output data received from the envelope data path 54A and the phase data path 56A.

In the depicted embodiment, the envelope data path 54A includes an envelope detector 70, a first delay device 72, and an envelope voltage amplifier 74. As described above, the envelope data path 54A may operate based at least in part on the amplitude component of the analog electrical signal 60. Thus, in some embodiments, the envelope detector 70 may extract an amplitude signal, which indicates the amplitude component, from the analog electrical signal 60. In other embodiments, the transceiver 38 may communicate the amplitude signal directly to the envelope data path 54A, for example via a digital electrical signal, thereby obviating the envelope detector 70.

After the amplitude signal is determined, the first delay device 72 may apply a delay to the amplitude signal. In some embodiments, the amount of delay applied to the amplitude signal may be adjustable over a range (e.g., 0 ms to 50 ms) based on delay control commands received from the controller 46. In this manner, the amount of delay applied by the first delay device 72 may be adjusted to control when the envelope data path 54A outputs data to the power amplifier 66, for example, to facilitate improving synchronization (e.g., reducing time skew) with the phase data path 56A.

The output data from the envelope data path 54A may be an envelope signal generated by the envelope voltage amplifier 74 and supplied to the power amplifier 66 via a power supply rail 75. In some embodiments, the envelope voltage amplifier 74 may generate the envelope signal by amplifying voltage of the amplitude signal based at least in part on target output power of the radio frequency system 12, which may be indicated by target output power control commands received from the controller 46. For example, the envelope voltage amplifier 74 may increase amplification as the target output power increases and decrease amplification as the target output power decreases.

To facilitate generating the envelope signal, the envelope voltage amplifier 74 may receive electrical power from the power source 22. In some embodiments, the electrical power may have a constant direct current (DC) voltage and the envelope voltage amplifier 74 may include a switch mode power amplifier. In such embodiments, the switch mode power amplifier may facilitate generating the envelope signal by adjusting duration the constant DC voltage is supplied to the power supply rail 75 based at least in part on the amplitude signal.

Additionally, in the depicted embodiment, the phase data path 56A includes a limiter 76, a second delay device 78, and a transmission local oscillator 80. As described above, the phase data path 56A may operate based at least in part on the phase component of the analog electrical signal 60. Thus, in some embodiments, the limiter 76 may extract a phase signal, which indicates the phase component, from the analog electrical signal 60. In other embodiments, the transceiver 38 may communicate the phase signal directly to the phase data path 56A, thereby obviating the limiter 76.

After the phase signal is determined, the second delay device 78 may apply a delay to the phase signal. In some embodiments, the amount of delay applied to the phase signal may be adjustable over a range (e.g., 0 ms to 50 ms) based on delay control commands received from the controller 46. In this manner, the amount of delay applied by the second delay device 78 may be adjusted to control when the phase data path 56A outputs data to the power amplifier 66, for example, to facilitate improving synchronization (e.g., reducing time skew) with the envelope data path 54A.

The output data from the phase data path 56A may be a frequency converted phase signal generated by the transmission local oscillator 80. In some embodiments, the transmission local oscillator 80 may generate the frequency converted phase signal by adjusting frequency of the phase signal based at least in part on target output frequency of the radio frequency system 12, which may be indicated by target output frequency control commands received from the controller 46. For example, the transmission local oscillator 80 may upconvert the phase signal when the target output frequency is greater than the frequency of the phase signal and downconvert the phase signal when the target output frequency is less than the frequency of the phase signal.

As described above, the power amplifier 66 may receive and combine output data (e.g., envelope signal) from the envelope data path 54A and output data (e.g., frequency converted phase signal) from the phase data path 56A. In some embodiments, the power amplifier 66 may be a switched mode (e.g., class-D or class-E) power amplifier. Thus, in such embodiments, the power amplifier 66 combine the output data by connecting an output 82 to the power supply rail 75 that carries the envelope signal or ground based on the frequency converted phase signal. For example, when the frequency converted phase signal is high (e.g., above a threshold voltage), the power amplifier 66 may connect the output 82 to the power supply rail 75. On the other hand, when the frequency converted phase signal is low (e.g., below the threshold voltage), the power amplifier 66 may connect the output 82 to ground.

Thus, in some embodiments, the power amplifier 66 (e.g., a class-D amplifier) may generate a pulse-width-modulated signal based on the envelope signal and the frequency converted phase signal. In such embodiments, to generate the amplified analog electrical signal 62, the filter 68 may perform a filtering operation on the pulse-width-modulated signal. In some embodiments, the filter 68 may perform a low pass filtering operation, thereby smoothing the pulse-width-modulated signal to generate the amplified analog electrical signal 62.

In other embodiments, the power amplifier 66 (e.g., a class-E amplifier) may include an inductor capacitor (LC) circuit coupled in series with the output 82, a capacitor coupled in parallel with the LC circuit, and an inductor coupled to the power supply rail 75. In such embodiments, the power amplifier 66 may directly generate the amplified analog electrical signal 62, thereby obviating the separate filter 68. In this manner, the amplifier device 40A may implement envelope-elimination and restoration to generate the amplified analog electrical signal 62 based at least in part on target output power and/or target output frequency of the radio frequency system 12.

Figure 7B:
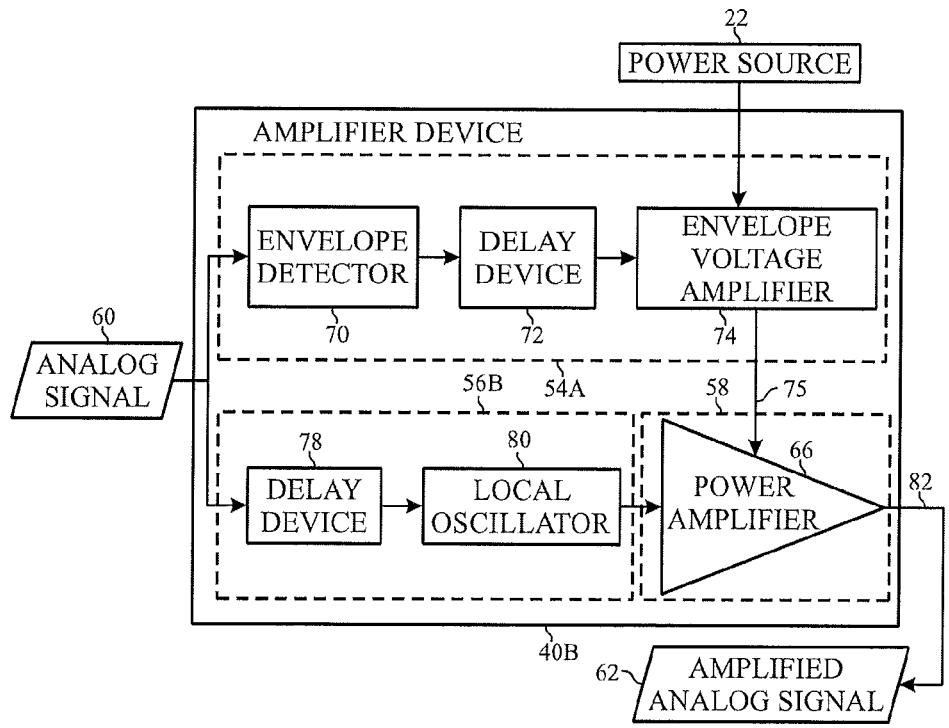
FIG. 7B is a block diagram of another example of the amplifier device of FIG. 6, in accordance with an embodiment.

In addition to envelope-elimination and restoration, other implementations of the amplifier device 40 may also facilitate generating the amplified analog electrical signal 62 using a first data path 54 and a second data path 56. For example, an amplifier device 40B with an envelope tracking (ET) implementation is shown in FIG. 7B. As depicted, the amplifier device 40B receives the analog electrical signal 60 and outputs the amplified analog electrical signal 62.

To facilitate generating the amplified analog electrical signal 62, the first data path 54 may be an envelope data path 54A, which operates based at least in part on the amplitude component of the analog electrical signal 60, and the second data path 56 may be a signal data path 56B, which operates based at least in part on the analog electrical signal 60 (e.g., both amplitude and phase component). Additionally, in the envelope tracking implementation, the mixer 58 may include a power amplifier 66 (e.g., a linear mode power amplifier) to facilitate generating the amplified analog electrical signal 62 by combining output data received from the envelope data path 54A and the signal data path 56B.

In some embodiments, the envelope data path 54A in the envelope tracking implementation may be operationally similar to the envelope data path 54A in the envelope elimination and restoration implementation. Thus, the envelope data path 54A may determine the amplitude signal, for example, using the envelope detector 70 and/or directly from the transceiver 38 as a digital electrical signal. Additionally, the first delay device 72 may apply a delay to the amplitude signal, which may be adjustable over a range (e.g., 0 ms to 50 ms) based on delay control commands received from the controller 46, for example, to facilitate improving synchronization (e.g., reducing time skew) with the signal data path 56B. Furthermore, the envelope voltage amplifier 74 may generate the envelope signal by amplifying voltage of the amplitude signal based at least in part on target output power of the radio frequency system 12, which may be indicated by target output power control commands received from the controller 46.

On the other hand, instead of the phase data path 56A, the amplifier device 40B may utilize the signal data path 56B, which includes the second delay device 78 and the transmission local oscillator 80. As described above, the signal data path 56B may operate based at least in part on both the phase component and the amplitude component of the analog electrical signal 60. Thus, in some embodiments, the signal data path 56B may receive the analog electrical signal 60 directly from the transceiver 38.

After the analog electrical signal 60 is determined, the second delay device 78 may apply a delay to the analog electrical signal 60. In some embodiments, the amount of delay applied to the phase signal may be adjustable over a range (e.g., 0 ms to 50 ms) based on delay control commands received from the controller 46. In this manner, the amount of delay applied by the second delay device 78 may be adjusted to control when the signal data path 56B outputs data to the power amplifier 66, for example, to facilitate improving synchronization (e.g., reducing time skew) with the envelope data path 54A.

The output data from the signal data path 56B may be a frequency converted signal generated by the transmission local oscillator 80. In some embodiments, the transmission local oscillator 80 may generate the frequency converted signal by adjusting frequency of the analog electrical signal 60 based at least in part on target output frequency of the radio frequency system 12, which may be indicated by target output frequency control commands received from the controller 46. For example, the transmission local oscillator 80 may upconvert the analog electrical signal 60 when the target output frequency is greater than the frequency of the analog electrical signal and downconvert the analog electrical signal 60 when the target output frequency is less than the frequency of the analog electrical signal 60.

As described above, the power amplifier 66 may receive and combine output data (e.g., envelope signal) from the envelope data path 54A and output data (e.g., frequency converted signal) from the signal data path 56B to generate the amplified analog electrical signal 62. In some embodiments, the power amplifier 66 may be a linear mode (e.g., class-A, class-B, class-AB, or class-C) power amplifier. Thus, in such embodiments, the power amplifier 66 may combine the output data by adjusting electrical power flowing from the power supply rail 75, which carries the envelope signal, to the output 82 in a manner approximately proportional to the frequency converted signal. For example, when the frequency converted signal increase, the power amplifier 66 may proportionally increase electrical power supplied from the power supply rail 75 to the output 82. On the other hand, when the frequency converted signal decreases, the power amplifier 66 may proportionally decrease power supplied from the power supply rail 75 to the output 82. In this manner, the amplifier device 40B may implement envelope tracking to generate the amplified analog electrical signal 62 based at least in part on target output power and/or target output frequency of the radio frequency system 12.

Returning to the radio frequency system 12 described in FIG. 6, in some instances, the transceiver 38 and/or the amplifier device 40 may introduce noise, such as spurious or out of band noise, in the amplified analog electrical signal 62. Thus, to facilitate improving accuracy of data wireless transmitted from the radio frequency system 12, the filter device 42 may perform a filtering operation on the amplified analog electrical signal 62 to remove introduced noise and output a filtered analog electrical signal. Based at least in part on the filtered analog electrical signal, the antenna 44 may modulate radio waves to wirelessly communicate a transmitted analog electrical signal to another electronic device and/or a network.

A feedback signal based at least in part on the transmitted analog electrical signal may also be fed back to the controller 46, for example, via a coupler. In some embodiments, the feedback local oscillator 48 may generate a feedback signal by adjusting frequency of the transmitted analog electrical signal. For example, the feedback local oscillator 48 may generate the feedback signal by converting the transmitted analog electrical signal into the frequency domain of the analog electrical signal 60. In other words, the feedback local oscillator 48 may adjust the frequency in a manner opposite the transmission local oscillator 80. For example, the feedback local oscillator 48 may upconvert the frequency when the transmission local oscillator 80 downconverted the frequency and downconvert the frequency when the transmission local oscillator 80 upconverted the frequency.

In the depicted embodiment, the feedback local oscillator 48 is depicted as a separate component to facilitate clarity. However, in some embodiments, the feedback local oscillator 48 may be included in the transmission local oscillator 80. In other words, in such embodiments, the transmission local oscillator 80 may be used to frequency convert the analog electrical signal 60 and/or the phase signal to facilitate generating the transmitted analog electrical signal and frequency convert the transmitted electrical signal to facilitate determining the feedback signal.

Based at least in part on the feedback signal, the controller 46 may monitor and/or control (e.g., adjust) operation of the radio frequency system 12. For example, in some embodiments, the controller 46 may determine actual output power of the transmitted analog electrical signal based at least in part on the feedback signal and instruct the radio frequency system 12 to adjust operation when the actual output power and the target output power vary. Additionally, in some embodiments, the controller 46 may determine time skew between the first data path 54 and the second data path 56 based at least in part on the feedback signal and instruct the first delay device 72 and/or the second delay device 78 to adjust applied delay accordingly.

Figure 8:
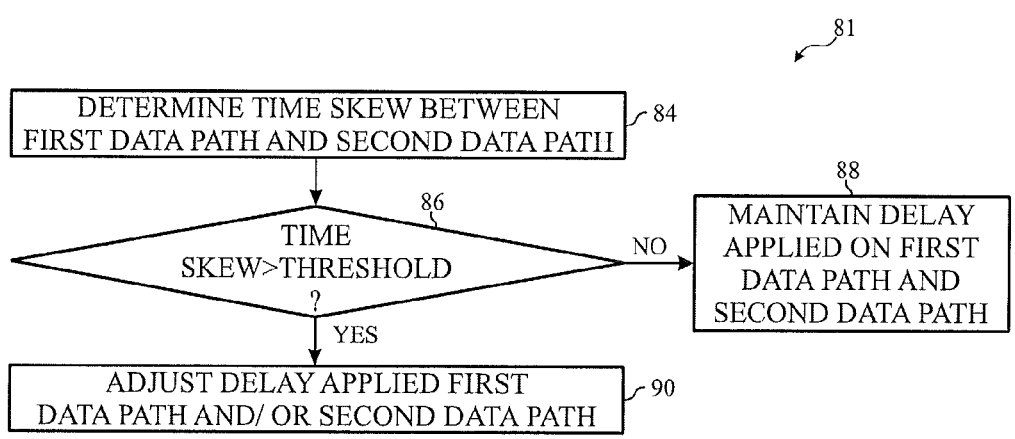
FIG. 8 is a flow diagram of a process for synchronizing two data paths in the amplifier device of FIG. 6, in accordance with an embodiment.

To help illustrate, one embodiment of a process 81 for controlling delay applied in a radio frequency system 12 is shown in FIG. 8. Generally, the process 81 includes determining time skew between a first data path and second data path (process block 84), determining whether the time skew is greater than a threshold (decision block 86), maintaining delay applied on the first data path and the second data path when the time skew is not greater than the threshold (process block 88), and adjusting the delay applied on the first data path and/or the second data path when the time skew is greater than the threshold (process block 90). In some embodiments, the process 81 may be implemented by executing instructions stored in a tangible, non-transitory, computer-readable medium, such as the memory device 52, using processing circuitry, such as the processing device 50.

Accordingly, in some embodiments, the controller 46 may determine time skew between the first data path 54 and the second data path 56 (decision block 86). In some embodiments, the time skew may indicate a duration (e.g., clock cycles or time) difference between when the power amplifier 66 receives output data from the first data path 54 and output data from the second data path 56 corresponding with the same point on the analog electrical signal 60. As such, the time skew may be dependent on at least relative delay of the first data path 54 and relative delay of the second data path 56.

Figure 9:
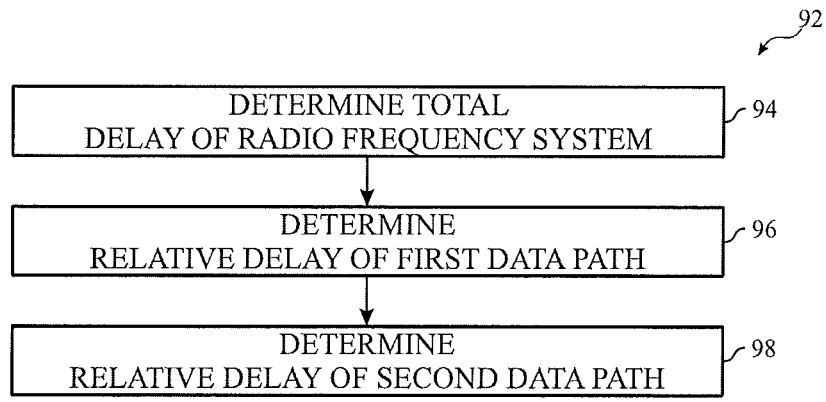
FIG. 9 is a flow diagram of a process for determining time skew between the two data paths, in accordance with an embodiment.

One embodiment of a process 92 for determining time skew between a first data path 54 and a second data path 56 is shown in FIG. 9. Generally, the process 92 includes determining a total delay of a radio frequency system (process block 94), determining a relative delay of a first data path (process block 96), and determining a relative delay of a second data path (process block 98). In some embodiments, the process 92 may be implemented by executing instructions stored in a tangible, non-transitory, computer-readable medium, such as the memory device 52, using processing circuitry, such as the processing device 50.

Accordingly, in some embodiments, the controller 46 may determine total delay of the radio frequency system 12 (process block 94). In some embodiments, the total delay may indicate duration difference between when the digital electrical signal is input to the transceiver 38 and when the controller 46 receives the feedback signal resulting from corresponding transmission. Thus, the total delay may include delay caused by the first data path 54 and the second data path 56 as well as other components in the radio frequency system 12, such as the transmission local oscillator 80 and/or the feedback local oscillator 48.

Figure 10:
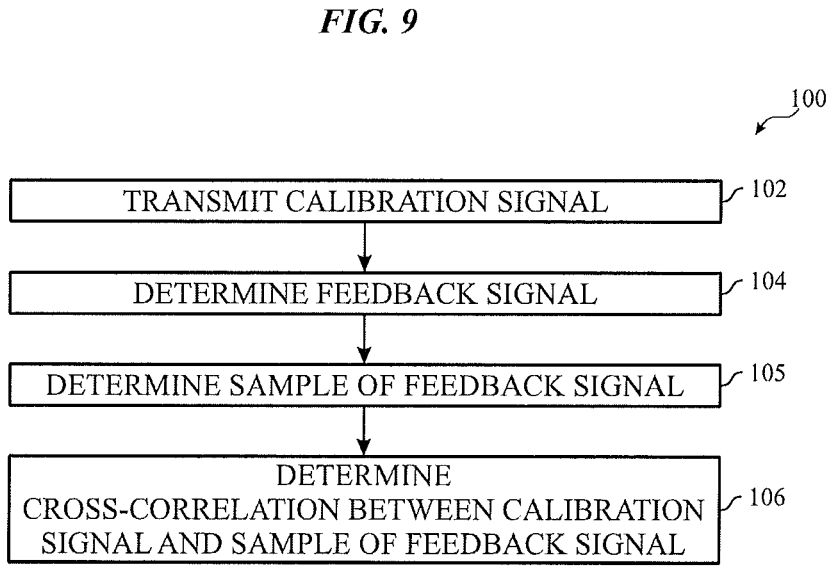
FIG. 10 is a flow diagram of a process for determining a total delay of the radio frequency system of FIG. 6, in accordance with an embodiment.

One embodiment of a process 100 for determining total delay of a radio frequency system 12 is shown in FIG. 10. Generally, the process 100 includes transmitting a calibration signal (process block 102), determining a feedback signal (process block 104), determining a sample of the feedback signal (process block 105), and determining cross-correlation between the calibration signal and the feedback signal (process block 106). In some embodiments, the process 100 may be implemented by executing instructions stored in a tangible, non-transitory, computer-readable medium, such as the memory device 52, using processing circuitry, such as the processing device 50.

Accordingly, in some embodiments, the controller 46 may instruct the radio frequency system 12 to transmit a calibration signal (process block 102). Additionally, in some embodiments, the controller 46 may instruct the radio frequency system 12 to successively repeat transmission of the calibration signal. Furthermore, in some embodiments, the calibration signal may be pre-determined and stored, for example, in the memory device 52. Thus, in such embodiments, the controller 46 may retrieve and supply the calibration signal to the radio frequency system 12, for example, directly to the transceiver 38 and/or via the digital data source 36.

As described above, in some embodiments, the calibration signal may include multiple portions. For example, the calibration signal may include a first portion (e.g., half) used to determine the relative delay of the first data path 54. Additionally, the calibration signal may include a second portion (e.g., half) used to determine the relative delay of the second data path 56. For example, when the calibration signal is a 2N duration signal, the first portion may be a first N duration signal and the second portion may be a second N duration signal. Accordingly, in such embodiments, the calibration signal may be determined to enable determining the total delay of the radio frequency system 12, the relative delay of the first data path 54, and the relative delay of the second data path 56.

Figure 11:
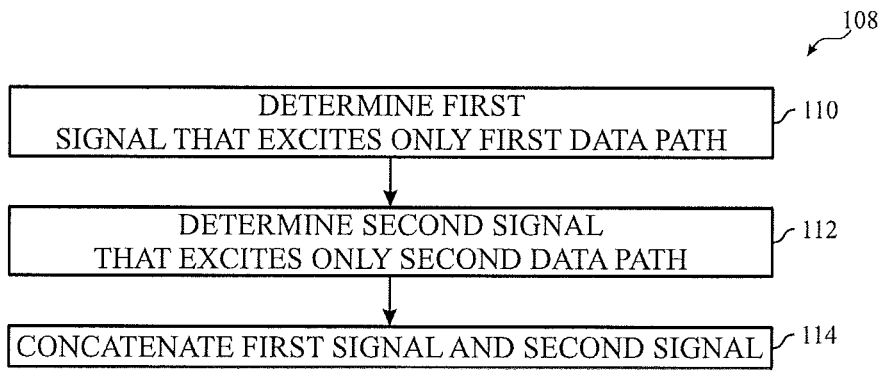
FIG. 11 is a flow diagram of a process for determining a calibration signal used to determine the time skew, in accordance with an embodiment.

To help illustrate, one embodiment of a process 108 for determining a suitable calibration signal is described in FIG. 11. Generally, the process 108 includes determining a first signal that excites only a first data path (process block 110), a second signal that excites only a second data path (process block 112), and concatenating the first signal and the second signal (process block 114). In some embodiments, the process 108 may be implemented by executing instructions stored in a tangible, non-transitory, computer-readable medium, such as the memory device 52, using processing circuitry, such as the processing device 50. For the purpose of illustration and brevity, the process 108 will be described as being implemented in the controller 46. However, in other embodiments, the process 108 may be implemented by a separate calibration system, for example, an electronic device used by a manufacturer of the radio frequency system 12.

In the illustrative embodiment, the controller 46 may determine a first signal that excites only the first data path 54 (process block 110) and a second signal that excites only the second data path 56 (process block 112). In other words, the controller 46 may determine the first signal and the second signal based at least in part on how the first data path 54 and the second data path 56 are expected to operate. As described above, operation of the first data path 54 and the second data path 56 may vary between different implementations of the amplifier device 40. In other words, the first signal and the second signal determined for use in an envelope elimination and restoration (EER) amplifier device 40A may be different from the first signal and the second signal determined for use in an envelope tracking (ET) amplifier device 40B. However, to facilitate brevity, determination of the first signal and the second signal will be described in reference to an envelope elimination and restoration amplifier device 40A.

As described above, in an envelope elimination and restoration amplifier device 40A, the envelope data path 54A may operate based at least in part on the amplitude component of the data to be wirelessly transmitted and the phase data path 56A may operate based at least in part on the phase component of the data to be wirelessly transmitted. Thus, the first signal may be determined such that its amplitude component is changing and its phase component is constant. Additionally, the second signal may be determined such that its amplitude component is constant and its phase component is changing.

To generate the calibration signal, the controller 46 may concatenate the first signal and the second signal (process block 114). Thus, in some embodiments, the controller 46 may additionally determine the first signal and the second signal to facilitate a smooth transition therebetween. For example, the second signal may be determined such that the initial value of its amplitude component is approximately equal to the final value of the amplitude component at the end of the first signal. Additionally, the second signal may be determined such that the initial value of its phase component is approximately equal to the final value of the phase component of at the end of the first signal.

Figure 12A:
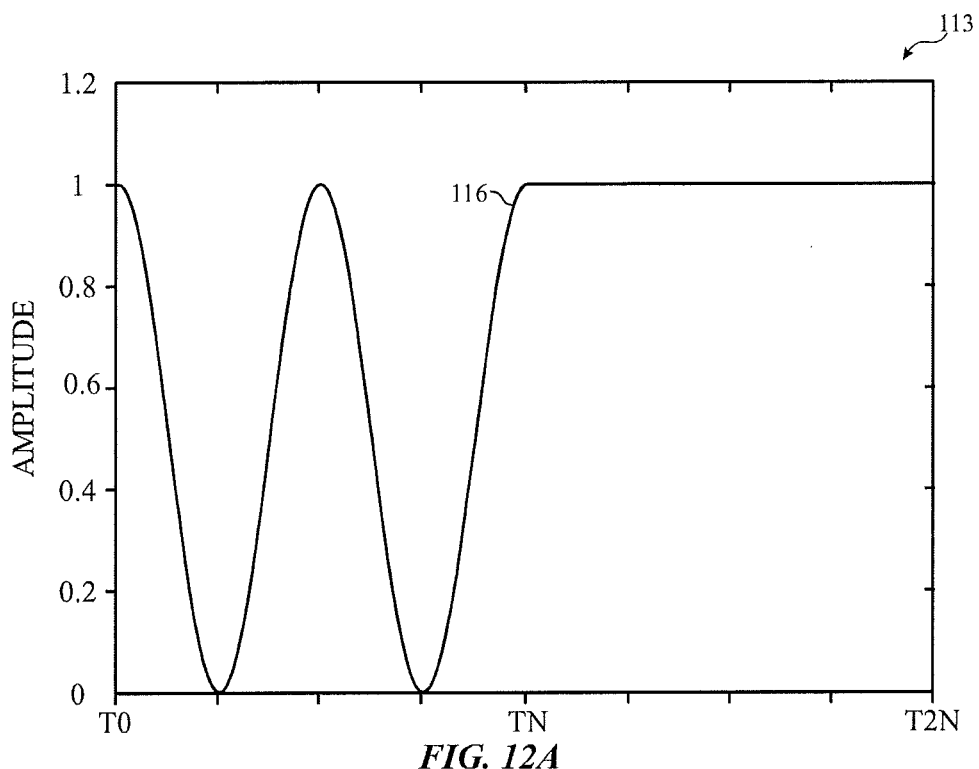
FIG. 12A is a plot of amplitude of an example calibration signal, in accordance with an embodiment.
Figure 12B:
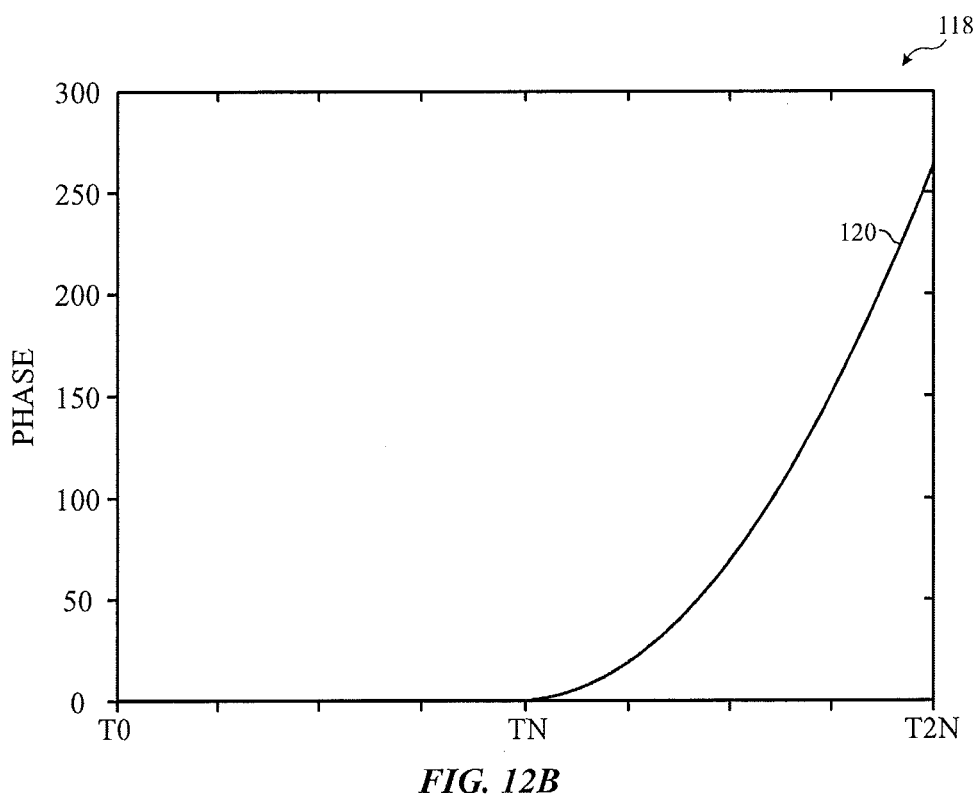
FIG. 12B is a plot of phase of the example calibration signal, in accordance with an embodiment.

To help illustrate, one example of a calibration signal that may be used with an envelope elimination and restoration amplifier device 40A is shown in FIGS. 12A and 12B. Specifically, FIG. 12A includes a plot 113 with an amplitude curve 116, which describes the amplitude component of the calibration signal from t0 to tN and from tN to t2N. Additionally, FIG. 12B includes a plot 118 with a phase curve 120, which describes the phase component of the calibration signal from t0 to tN and from tN to t2N.

In some embodiments, the calibration signal described in FIGS. 12A and 12B may be expressed as follows:

$$C(t) = \begin{cases} D + E\cos(2\pi\omega(t)); & 0 \le t \le N-1 \\ e^{j(\alpha t^2 + \beta t + \gamma)}; & N-1 \le t \le 2N-1 \end{cases} \quad (3)$$

where C(t) is the calibration signal at time t, $\omega$ is an angular frequency tuning parameter, D and E are real value tuning parameter coefficients, and $\alpha$, $\beta$, and $\gamma$ are tuning parameters. Thus, as depicted in FIGS. 12A and 12B, the amplitude component of the calibration signal oscillates between 1 and 0 while the phase component of the calibration signal is zero during t0 to tN. Accordingly, between t0 and tN, the calibration signal may excite the envelope data path 54A without exciting the phase data path 56A and, thus, may be the first signal. Additionally, as depicted in FIGS. 12A and 12B, the phase component of the calibration signal increases approximately exponentially and the amplitude component of the calibration signal is 1 during tN to t2N. Accordingly, between tN and t2N, the calibration signal may excite the phase data path 56A without exciting the envelope data path 54A and, thus, may be the second signal. In this manner, a calibration signal to be transmitted in the radio frequency system 12 may be determined.

Returning to the process 100 of FIG. 10, the controller 46 may determine a feedback signal resulting from transmission of the calibration signal from the radio frequency system 12 (process block 102). As described above, in some embodiments, the feedback local oscillator 48 may generate a feedback signal by adjusting frequency of a transmitted analog electrical signal supplied to the antenna 44, for example, based at least in part on frequency adjustment applied by the transmission local oscillator 80. As such, the controller 46 may receive the feedback signal resulting from repeated transmission of the calibration signal from the feedback local oscillator 48.

Additionally, the controller 46 may determine a sample from the feedback signal (process block 105). In some embodiments, the controller 46 may determine the sample based at least in part on duration of the calibration signal. For example, when duration of the calibration signal is 2N, the controller may select a 2N duration of the feedback signal as the sample.

To determine the total delay of the radio frequency system 12, the controller 46 may determine cross-correlation based at least in part on the calibration signal and the sample of the feedback signal (process block 106). For example, in some embodiments, the controller 46 may execute a fast-Fourier-transform (FFT) on the calibration signal to determine a first discrete-Fourier-transform (DFT) that represents the calibration signal in a frequency domain. Additionally, the controller 46 may execute a fast-Fourier-transform (FFT) on the calibration signal to determine a second discrete-Fourier-transform (DFT) that represents the sample signal in the frequency domain.

By determining a cross-correlation function based on the first discrete-Fourier-transform and the second discrete-Fourier-transform, the controller 46 may determine similarity of the calibration signal and the sample as a function of relative lag therebetween. Thus, by converting the cross-correlation back to the time domain, the controller 46 may determine similarity of the calibration signal and the sample at various lag values. In this manner, the controller 46 may determine that the lag value corresponding with the peak cross-correlation magnitude is the total delay of the radio frequency system 12.

Returning to the process 92 described in FIG. 9, the controller 46 may determine relative delay of the first data path 54 (process block 96). In some embodiments, relative delay of the first data path 54 may be determined based at least in part on the total delay of the radio frequency system 12. By determining the relative delay in this manner, the controller 46 may isolate delay caused by amplifier device 40 from the delay caused by other components in the radio frequency system 12, such as the transmission local oscillator 80 and/or the feedback local oscillator 48.

Figure 13:
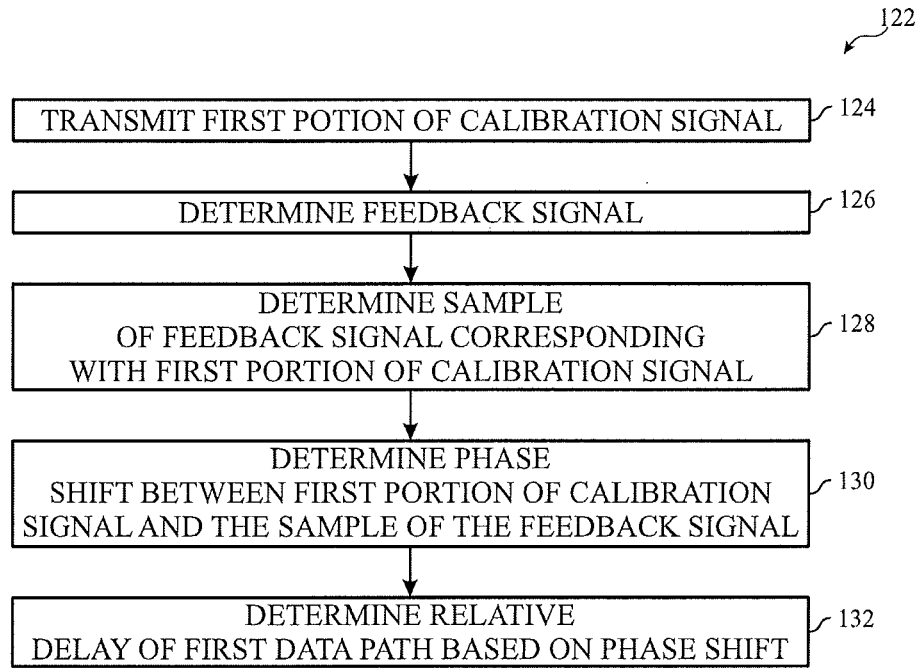
FIG. 13 is a flow diagram of a process for determining path delay of a first data path in the amplifier device of FIG. 6, in accordance with an embodiment.

To help illustrate, one embodiment of process 122 for determining relative delay of a first data path 54 is shown in FIG. 13. Generally, the process 122 includes transmitting a first portion of a calibration signal (process block 124), determining a feedback signal (process block 126), determining a sample of the feedback signal corresponding with the first portion of the calibration signal (process block 128), determining phase shift between the first portion of the calibration signal and the sample (process block 130), and determining relative delay of a first data path based on the phase shift (process block 132). In some embodiments, the process 122 may be implemented by executing instructions stored in a tangible, non-transitory, computer-readable medium, such as the memory device 52, using processing circuitry, such as the processing device 50.

Accordingly, in some embodiments, the controller 46 may instruct the radio frequency system 12 to transmit a first portion of the calibration signal (process block 124). In some embodiments, the first portion may include the first signal, which excites the first data path 54 without exciting the second data path 56. Additionally, the controller 46 may determine a feedback signal (process block 126). As described above, in some embodiments, the feedback local oscillator 48 may generate the feedback signal by adjusting frequency of a transmitted analog electrical signal. Thus, in such embodiments, the controller 46 may receive the feedback signal from the feedback local oscillator 48.

From the feedback signal the controller 46 may determine a first sample resulting from transmission of the first portion of the calibration signal from the radio frequency system 12 (process block 128). To facilitate determining the first sample, the controller 46 may adjust the feedback signal based at least in part on total delay of the radio frequency system 12. For example, the controller 46 may time shift the feedback signal by the total delay to isolate the delay caused by the amplifier device 40 from the delay caused by other components of the radio frequency system 12.

After adjusting the feedback signal, the controller 46 may determine the first sample by selecting a portion of the feedback signal based at least in part on duration of the first portion of the calibration signal. For example, when the duration of the first portion is N, the controller 46 may determine the first sample by selecting an N duration portion from the delay adjusted feedback signal. Since the first portion of the calibration signal excites the first data path 54 without exciting the second data path 56, the controller 46 may determine the first sample to isolate the delay caused by the first data path 54 from the delay caused by the second data path 56.

When the calibration signal described in equation (3) is used, the first sample corresponding with transmission of the first portion (e.g., $0 \leq t \leq N-1$) of the calibration signal may be as follows:

$$F_1(t) = C + D \cos(2\pi\omega(t+\tau_1)) \quad (4)$$

where $F_1(t)$ is the first sample corresponding with the first portion of the calibration signal, $\omega$ is the angular frequency tuning parameter, C and D are tuning parameter coefficients, and $\tau_1$ is the relative phase delay of the first data path 54. In some instances, C and/or D may be complex values due to phase uncertainty introduced by the transmission local oscillator 80 and/or the feedback local oscillator 48.

Additionally, the controller 46 may determine phase shift between the first portion of the calibration signal and the first sample of the feedback signal (process block 130). In some embodiments, to facilitate determining the phase shift, the controller 46 may determine an N×5 matrix as follows:

$$M_1[i,1] = \sin(2\pi\omega(i-1)); i=[1:N] \quad (5)$$

$$M_1[i,2] = \cos(2\pi\omega(i-1)); i=[1:N]$$

$$M_1[i,3] = j\sin(2\pi\omega(i-1)); i=[1:N]$$

$$M_1[i,4] = j\cos(2\pi\omega(i-1)); i=[1:N]$$

$$M_1[i,5] = 1; i=[1:N]$$

where $M_1$ is the N×5 matrix, N is the duration of the first portion of the calibration signal, and $\omega$ is the angular frequency tuning parameter. Based on the N×5 matrix, the controller 46 may determine a 5×1 vector as follows:

$$\theta = (M_1^T M_1)^{-1} M_1^T F_1 \quad (6)$$

where $\theta$ is the 5×1 vector, $F_1$ is the first sample of the feedback signal, and $M_1$ is the N×5 matrix described in equation (5). In such embodiments, based on the 5×1 vector, the controller 46 may determine the phase shift as follows:

$$\varphi = \arctan\left(\frac{\theta[2] + j\theta[4]}{\theta[1] + j\theta[3]}\right) \quad (7)$$

where $\varphi$ is the phase shift, $\theta[1]$ is the first entry in the 5×1 vector, $\theta[2]$ is the second entry in the 5×1 vector, $\theta[3]$ is the third entry in the 5×1 vector, and $\theta[4]$ is the fourth entry in the 5×1 vector.

Based at least in part on the phase shift, the controller 46 may determine the relative delay of the first data path 54 (process block 132). When the calibration signal of equation (3) is used, the relative delay of the first data path 54 may be proportional to the phase shift between the first portion of the calibration signal and the first sample of the feedback signal. For example, the relative delay of the first data path 54 may be determined as follows:

$$\tau_1 = \frac{\varphi}{\omega} \quad (8)$$

where $\tau_1$ is the relative phase delay of the first data path 54, $\varphi$ is the phase shift, and $\omega$ is the angular frequency tuning parameter. In this manner, the controller 46 may determine the relative phase delay of the first data path 54.

Returning to the process 92 of FIG. 9, the controller 46 may also determine relative delay of the second data path 56 (process block 98). In some embodiments, relative delay of the second data path 56 may be determined based at least in part on the total delay of the radio frequency system 12. By determining the relative delay in this manner, the controller 46 may isolate delay caused by amplifier device 40 from the delay caused by other components in the radio frequency system 12, such as the transmission local oscillator 80 and/or the feedback local oscillator 48.

Figure 14:
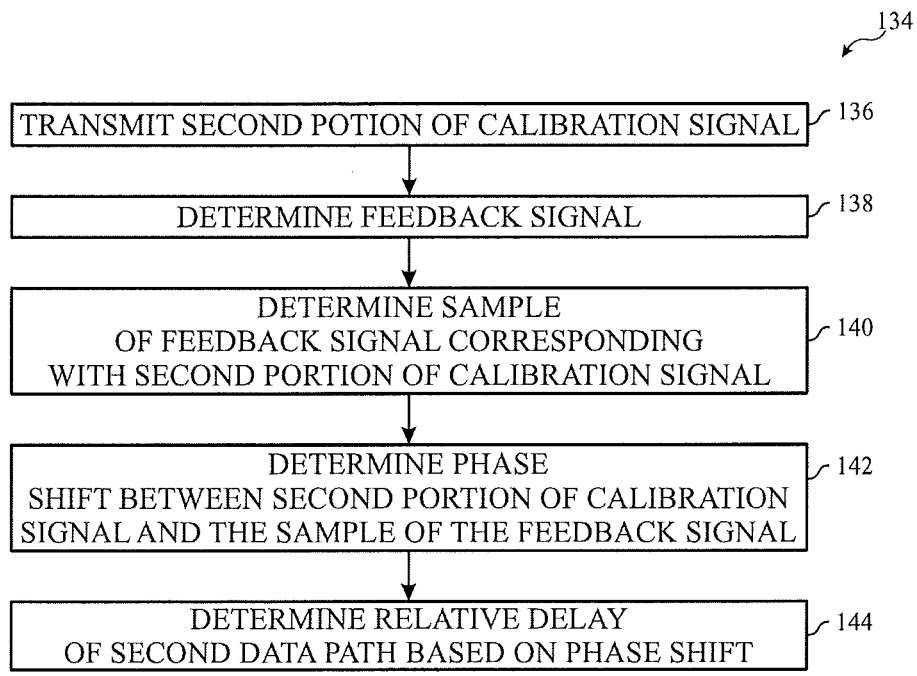
FIG. 14 is a flow diagram of a process for determining path delay of a second data path in the amplifier device of FIG. 6, in accordance with an embodiment.

To help illustrate, one embodiment of a process 134 for determining relative phase delay of a second data path 56 is described in FIG. 14. Generally, the process 134 includes transmitting a second portion of a calibration signal (process block 136), determining a feedback signal (process block 138), determining a sample of the feedback signal corresponding with the second portion of the calibration signal (process block 140), determining phase shift between the second portion of the calibration signal and the sample (process block 142), and determining a relative delay of the second data path based on the phase shift (process block 144). In some embodiments, the process 134 may be implemented by executing instructions stored in a tangible, non-transitory, computer-readable medium, such as the memory device 52, using processing circuitry, such as the processing device 50.

Accordingly, in some embodiments, the controller 46 may instruct the radio frequency system 12 to transmit a second portion of the calibration signal (process block 136). In some embodiments, the second portion may include the second signal, which excites the second data path 56 without exciting the first data path 54. Additionally, the controller 46 may determine a feedback signal (process block 138). As described above, in some embodiments, the feedback local oscillator 48 may generate the feedback signal by adjusting frequency of a transmitted analog electrical signal. Thus, in such embodiments, the controller 46 may receive the feedback signal from the feedback local oscillator 48.

From the feedback signal the controller 46 may determine a second sample resulting from transmission of the second portion of the calibration signal from the radio frequency system 12 (process block 128). To facilitate determining the second sample, the controller 46 may adjust the feedback signal based at least in part on total delay of the radio frequency system 12 and the duration of the first portion of the calibration signal. For example, the controller 46 may time shift the feedback signal by the total delay and the duration of the first portion of the calibration signal to isolate delay caused by the amplifier device 40 from the delay caused by other components of the radio frequency system 12.

After adjusting the feedback signal, the controller 46 may determine the second sample by selecting a portion of the feedback signal based at least in part on duration of the second portion of the calibration signal. For example, when the duration of the second portion is N, the controller 46 may determine the second sample by selecting an N duration portion from the delay adjusted feedback signal. Since the second portion of the calibration signal excites the second data path 56 without exciting the first data path 54, the controller 46 may determine the second sample to isolate the delay caused by the second data path 56 from the delay caused by the first data path 54.

When the calibration signal described in equation (3) is used, the second sample corresponding with transmission of the second portion (e.g., $N-1 < t \leq 2N-1$) of the calibration signal may be as follows:

$$F_2(t) = e^{j(\alpha t^2 + (\beta - 2\alpha\tau_2)t + (\gamma - \alpha\tau_2^2 - \beta\tau_2))} \quad (9)$$

where $F_2(t)$ is the second, $\tau_2$ is the relative phase delay of the second data path 56, and $\alpha$, $\beta$, and $\gamma$ are tuning parameters.

The controller 46 may then determine phase shift between the second portion of the calibration signal and the second sample of the feedback signal (process block 142). In some embodiments, to facilitate determining the phase shift, the controller may determine an N×3 matrix as follows:

$$M_2[i,1] = (i-1)^2; i = [1:N]$$ (10)

$$M_2[i,2] = (i-1); i = [1:N]$$

$$M_2[i,3] = 1; i = [1:N]$$

where $M_2$ is the N×3 matrix and N is the duration of the second portion of the calibration signal. Based on the N×3 matrix, the controller 46 may determine the phase shift as follows:

$$\Phi = (M_2^T M_2)^{-1} M_2^T \angle F_2 \quad (11)$$

where $\Phi$ is the phase shift, $F_2$ is the second sample of the feedback signal, and $M_2$ is the N×3 matrix described in equation (9). In some instances, the phase shift may include a quadratic component, a linear component, and/or a constant complex component.

Based at least in part on the phase shift, the controller 46 may determine the relative delay of the second data path 56 (process block 144). When the calibration signal of equation (3) is used, the relative delay of the second data path 56 may be proportional to the linear component of the phase shift between the second portion of the calibration signal and the second sample. For example, the relative delay of the second data path 56 may be determined as follows:

$$\tau_2 = \frac{\Phi[2] - \beta}{2\alpha} \quad (12)$$

where $\tau_2$ is the relative phase delay of the second data path 56, $\Phi[2]$ is the linear component of the phase shift, and $\alpha$ and $\beta$ are tuning parameters. In this manner, the controller 46 may determine the relative phase delay of the second data path 56.

As described above, based at least in part on the relative delays, the controller 46 may determine the time skew between the first data path 54 and the second data path 56. For example, the controller 46 may determine the time skew based on difference between the relative delay of the first data path 54 and the relative delay of the second data path 56. Thus, the time skew may indicative of synchronization between the first data path 54 and the second data path 56 and, thus, fidelity of transmitted analog electrical signals from the radio frequency system 12. For example, when time skew increases, fidelity of the transmitted analog electrical signals may decrease.

Thus, returning to the process 81 of FIG. 8, the controller 46 may determine whether the time skew between the first data path 54 and the second data path 56 is greater than a time skew threshold (decision block 86). In some embodiments, the time skew threshold may be pre-determined and stored in the memory device 52. Thus, in such embodiments, the controller 46 may retrieve and compare the time skew threshold with the time skew. Additionally, in some embodiments, the time skew threshold may be set as an indicator of whether acceptable fidelity is expected to result. For example, the time skew threshold may be set such that time skews not greater than the time skew threshold are expected to result in acceptable fidelity and time skews greater than the time skew threshold are not expected to result in acceptable fidelity.

Thus, when the time skew is not greater than the time skew threshold, the radio frequency system 12 may maintain delays applied on the first data path 54 and the second data path 56 (process block 88). For example, the controller 46 may instruct the first delay device 72 to maintain current delay applied on the first data path 54 and the second delay device 78 to maintain current delay applied on the second data path 56.

On the other hand, when the time skew is greater than the time skew threshold, the controller 46 may instruct the radio frequency system 12 to adjust delays applied on the first data path 54 and/or delays applied on the second data path 56 (process block 90). For example, when the time skew indicates that the relative delay of the first data path 54 is greater than the relative delay of the second data path 56 by more than the time skew threshold, the controller 46 may instruct the second delay device 78 to increase delay applied on the second data path 56 and/or the first delay device 72 to reduce delay applied on the first data path 54. Additionally, when the time skew indicates that the relative delay of the second data path 56 is greater than the relative delay of the first data path 54 by more than the time skew threshold, the controller 46 may instruct the second delay device 78 to decrease delay applied on the second data path 56 and/or the first delay device 72 to increase delay applied on the first data path 54.

In some embodiments, the controller 46 may continue adjusting the delay applied to the first data path 54 and/or the second data path 56 until the time skew is no longer greater than the time skew threshold. Additionally, in some embodiments, the controller 46 may periodically execute the calibration process 81 to account for changes in operational characteristics of the amplifier device 40 over time and/or due to environmental conditions, such as temperature. For example, the controller 46 may execute the calibration process 81 when the radio frequency system 12 is initially powered on, after a fixed duration, after a certain number of transmissions, and/or at any other suitable time.

Accordingly, the technical effects of the present disclosure include improving operation of a radio frequency system by facilitating improved fidelity of transmitted analog electrical signals. In some embodiments, the radio frequency system may improve fidelity of transmitted analog electrical signals by adjusting delay applied on one or more data paths in an amplifier device to reduce time skew between the data paths. To determine the time skew between the data paths, the radio frequency system may determine a total delay of the radio frequency system and a relative delay of each data path based at least in part on transmission of a calibration signal. In some embodiments, the calibration signal may include multiple portions, each of which excites one data path without exiting the other data paths. Based at least in part on a feedback signal resulting from transmission of the calibration signal, the radio frequency system may determine phase shift between a portion of the calibration signal and a corresponding sample from the feedback signal resulting from transmission of the portion. Additionally, based at least in part on the phase shifts, the radio frequency system may determine relative delay of each data path and, thus, the time skew between the data paths.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising a radio frequency system configured to wirelessly transmit data, wherein the radio frequency system comprises:
    an amplifier device comprising a first data path and a second data path, wherein the amplifier device is configured to:
        receive an analog representation of the data as an analog electrical signal, a digital representation of the data as a digital electrical signal, or both; and
        generate an amplified analog electrical signal used to wirelessly transmit the data based on a first signal output from the first data path and a second signal output from the second data path; and
    a controller configured to:
        instruct the radio frequency system to transmit a calibration signal comprising a first portion configured to excite the first data path and a second portion configured to excite the second data path;
        determine a feedback signal resulting from transmission of the calibration signal;
        determine time skew between the first data path and the second data path based on one or more of:

a first phase shift between a first sample of the feedback signal and the first portion of the calibration signal; and a second phase shift between a second sample of the feedback signal and the second portion of the calibration signal; and instruct the radio frequency system to adjust at least one of a first delay applied on the first data path and a second delay applied on the second data path based on the time skew.

2. The electronic device of claim 1, wherein:

the first portion of the calibration signal comprises a first amplitude component and a first phase component, wherein the first amplitude component changes to excite the first data path and the first phase component is constant to not excite the second data path; and the second portion of the calibration signal comprises a second amplitude component and a second phase component, wherein the second phase component changes to excite the second data path and the first amplitude component is constant to not excite the first data path.

3. The electronic device of claim 1, wherein the controller is configured to:

determine a third sample of the feedback signal based on a first duration of the calibration signal;

determine a total delay of the radio frequency system based on cross-correlation between the third sample and the calibration signal; and determine the time skew based on the total delay of the radio frequency system.

4. The electronic device of claim 3, wherein the controller is configured to:

adjust the feedback signal based on the total delay of the radio frequency system;

determine the first sample of the feedback signal based on a second duration of the first portion of the calibration signal after the feedback signal is adjusted;

determine a first relative delay of the first data path based on the first phase shift between the first sample and the first portion of the calibration signal, wherein the first relative delay is proportional to the first phase shift;

determine the second sample of the feedback signal based on a third duration of the first portion of the calibration signal and the second portion of the calibration signal;

determine a second relative delay of the second data path based on the second phase shift between the second sample and the second portion of the calibration signal; and determine the time skew based on difference between the first relative delay and the second relative delay.

5. The electronic device of claim 1, wherein:

the first data path is configured to generate a variable voltage signal by amplifying an amplitude component of the data based on a target output power of the radio frequency system;

a second data path is configured to generate a frequency signal by adjusting frequency of a phase component of the data based on a target output frequency of the radio frequency system; and the amplifier device comprises a switch mode power amplifier configured to facilitate generating the amplified analog electrical signal based on the variable voltage signal and the frequency signal.

6. The electronic device of claim 1, wherein:

the first data path is configured to generate a variable voltage signal by amplifying an amplitude component of the data based on a target output power of the radio frequency system;

a second data path is configured to generate a frequency converted signal by adjusting frequency of the data based on a target output frequency of the radio frequency system; and the amplifier device comprises a linear mode power amplifier configured to generate the amplified analog electrical signal based on the variable voltage signal and the frequency converted signal.

7. The electronic device of claim 1, comprising:

an antenna configured to output a transmitted analog electrical signal as modulated radio waves based on the amplified analog electrical signal;

a coupler configured to feed back the transmitted analog electrical signal; and a feedback local oscillator configured to generate the feedback signal by adjusting frequency of the transmitted analog electrical signal.

8. The electronic device of claim 1, wherein:

the first data path comprises a first delay device configured to apply a first delay to the first signal;

the second data path comprises a second delay device configured to apply a second delay to the second signal; and the controller is configured to:

instruct at least one of the first delay device to decrease the first delay and the second delay device to increase the second delay when the time skew indicates that a first relative delay of the first data path is greater than a second relative delay of the second data path by more than a time skew threshold;

instruct at least one of the first delay device to increase the first delay and the second delay device to decrease the second delay when the time skew indicates that the second relative delay is greater than then first relative delay by more than the time skew threshold; and instruct the first delay device to maintain the first delay and the second delay to maintain the second delay otherwise.

9. The electronic device of claim 1, wherein the electronic device comprises a computer, a mobile phone, a portable media device, a tablet, a television, a virtual-reality headset, a personal data organizer, a handheld game platform, or a vehicle dashboard.

10. A tangible, non-transitory, computer-readable medium configured to store instructions executable by one or more processors of a radio frequency system, wherein the instructions comprise instructions to:

instruct, using the one or more processors, the radio frequency system to successively repeat transmission of a calibration signal at a target output power by amplifying the calibration signal using an amplifier device;

determine, using the one or more processors, a feedback signal resulting from transmission of the calibration signal;

determine, using the one or more processors, a total delay of the radio frequency system based at least in part on cross-correlation between the calibration signal and a first sample of the feedback signal;

determine, using the one or more processors, a first relative delay of an envelope data path in the amplifier device based at least in part on a first phase shift between a first portion of the calibration signal and a second sample of the feedback signal, wherein the first portion of the calibration signal comprises a changing amplitude component and a constant phase component;

determine, using the one or more processors, a second relative delay of a phase data path in the amplifier device based at least in part on a second phase shift between a second portion of the calibration signal and a third sample of the feedback signal, wherein the second portion of the calibration signal comprises a constant amplitude component and a changing phase component; and instruct, using the one or more processors, a first delay device to adjust a first delay applied on the envelope data path, a second delay device to adjust a second delay applied on the phase data path, or both when difference between the first relative delay and the second relative delay is greater than a threshold.

11. The computer-readable medium of claim 10, wherein the instructions to determine the total delay of the radio frequency system comprise instructions to:
determine the first sample based at least in part on duration of the calibration signal;
execute a fast-Fourier-transform on the calibration signal to determine a first discrete-Fourier-transform that represents the calibration signal in a frequency domain;
execute the fast-Fourier-transform on the first sample to determine a second discrete-Fourier-transform that represents the first sample in the frequency domain;
determine a cross-correlation function based on the first discrete-Fourier-transform and the second discrete-Fourier-transform, wherein the cross-correlation function is configured to indicate similarity of the calibration signal and the first sample as a function of relative lag; and
determine the total delay based at least in part on peak magnitude of the cross-correlation function.

12. The computer-readable medium of claim 10, wherein the instructions to determine the first relative delay comprise instructions to:
determine the second sample of the feedback signal based at least in part on total delay of the radio frequency system and duration of the first portion of the calibration signal; and
determine the first relative delay of the envelope data path, wherein the first relative delay is proportional to the first phase shift.

13. The computer-readable medium of claim 10, wherein the instructions to determine the second relative delay comprise instructions to:
determine the third sample of the feedback signal based at least in part on total delay of the radio frequency system, duration of the first portion of the calibration signal, and duration of the second portion of the calibration signal; and
determine the second relative delay of the phase data path, wherein the second relative delay is proportional to a linear component of the second phase shift.

14. The computer-readable medium of claim 10, wherein the instructions to the first delay device, the second delay device, or both comprise instructions to:
instruct the first delay device to increase the first delay, the second delay to decrease the second delay, or both when the second relative delay is greater than the first relative delay by more than the threshold; and
instruct the first delay device to decrease the first delay, the second delay device to increase the second delay, or both when the first relative delay is greater than the second relative delay by more than the threshold.

15. The computer-readable medium of claim 10, wherein:
the changing amplitude component of the first portion of the calibration signal oscillates sinusoidally; and
the changing phase component of the second portion of the calibration signal increases exponentially.

16. A method for operating a calibration system configured to calibrate a radio frequency system, comprising:
determining, using the calibration system, a first signal comprising a first amplitude component and a first phase component, wherein the first signal is configured to excite an envelope data path without exciting a phase data path when wirelessly transmitted from the radio frequency system;
determining, using the calibration system, a second signal comprising a second amplitude component and a second phase component, wherein initial value of the second amplitude component is equal to final value of the first amplitude component, initial value of the second phase component is equal to final value of the first phase component, and the second signal is configured to excite the phase data path without exciting the envelope data path when wirelessly transmitted from the radio frequency system;
concatenating, using the calibration system, the first signal and the second signal to generate a calibration signal, and
storing, using the calibration system, the calibration signal in the radio frequency system to enable the radio frequency system to adjust a first delay applied on the envelope data path, a second delay applied on the phase data path, or both based at least in part on repeated successive transmission of the calibration signal.

17. The method of claim 16, wherein storing the calibration signal enables the radio frequency system to:
determine a feedback signal based at least in part on the repeated successive transmission of the calibration signal;
determine a sample from the feedback signal based at least in part on duration of the calibration signal;
determine a total delay of the radio frequency system based at least in part on cross-correlation between the sample and the calibration signal; and
adjust the first delay, the second delay, or both based at least in part on the total delay of the radio frequency system.

18. The method of claim 16, wherein storing the calibration signal enables the radio frequency system to:
determine a feedback signal based at least in part on the repeated successive transmission of the calibration signal;
determine a sample from the feedback signal resulting from transmission of the first signal based at least in part on duration of the first signal and a total delay of the radio frequency system;
determine a relative delay of the envelope data path based at least in part on a phase shift between the sample and the first signal; and
adjust the first delay, the second delay, or both based at least in part on the relative delay of the envelope data path.

19. The method of claim 16, wherein storing the calibration signal enables the radio frequency system to:

determine a feedback signal based at least in part on the repeated successive transmission of the calibration signal;

determine a sample from the feedback signal resulting from transmission of the second signal based at least in part on duration of the first signal, duration of the second signal, and a total delay of the radio frequency system;

determine a relative delay of the phase data path based at least in part on a linear component of a phase shift between the sample and the second signal; and adjust the first delay, the second delay, or both based at least in part on the relative delay of the phase data path.

20. The method of claim 16, wherein:
the first amplitude component various sinusoidally;
the first phase component is constant;
the second amplitude component is constant; and
the second phase component increases exponentially.

* * * * *